(12) United States Patent
Patel et al.

(10) Patent No.: US 9,618,553 B2
(45) Date of Patent: Apr. 11, 2017

(54) SYSTEMS AND METHODS FOR SENSING ENVIRONMENTAL CHANGES USING LIGHT SOURCES AS SENSORS

(75) Inventors: Shwetak N. Patel, Seattle, WA (US); Sidhant Gupta, Seattle, WA (US); Matthew S. Reynolds, Seattle, WA (US)

(73) Assignee: University of Washington Through Its Center For Commercialization, Seattle, WA (US)

( * ) Notice: Subject to any disclaimer, the term of this patent is extended or adjusted under 35 U.S.C. 154(b) by 449 days.

(21) Appl. No.: 14/345,197

(22) PCT Filed: Sep. 14, 2012

(86) PCT No.: PCT/US2012/055632
§ 371 (c)(1),
(2), (4) Date: Sep. 10, 2014

(87) PCT Pub. No.: WO2013/040497
PCT Pub. Date: Mar. 21, 2013

(65) Prior Publication Data
US 2014/0375352 A1    Dec. 25, 2014

Related U.S. Application Data

(60) Provisional application No. 61/535,153, filed on Sep. 15, 2011.

(51) Int. Cl.
*G01R 31/40* (2014.01)
*G01R 29/08* (2006.01)
(Continued)

(52) U.S. Cl.
CPC ..... *G01R 29/0885* (2013.01); *G01R 29/0814* (2013.01); *G01R 31/001* (2013.01); *G01R 31/086* (2013.01)

(58) Field of Classification Search
None
See application file for complete search history.

(56) References Cited

U.S. PATENT DOCUMENTS

| 7,933,727 B2 | 4/2011 | Taulu et al. |
| 8,361,165 B2 * | 1/2013 | Karr ............... A61B 5/0031 |
| | | 128/899 |

(Continued)

FOREIGN PATENT DOCUMENTS

| JP | 2010/216948 | 9/2010 |
| KR | 10-0948805 | 3/2010 |

(Continued)

OTHER PUBLICATIONS

"International Search Report" dated Feb. 27, 2013 for PCT Application. No. PCT/US2012/055632.

(Continued)

*Primary Examiner* — Minh N Tang
(74) *Attorney, Agent, or Firm* — Dorsey & Whitney LLP

(57) ABSTRACT

Systems and methods for sensing environmental changes using electromagnetic interference (EMI) signals are disclosed herein. An EMI monitoring system may be used to monitor an EMI signal of one or more light sources provided over a power line, e.g., in a home or building. The received EMI energy at the power line may be analyzed to detect variations in the EMI signature indicative of environmental changes occurring in the proximity of the light sources. Environmental changes that may be sensed include, but are not limited to, proximity, touch, motion, and temperature change.

24 Claims, 8 Drawing Sheets

(51) Int. Cl.
  *G01R 31/00*  (2006.01)
  *G01R 31/08*  (2006.01)

(56) References Cited

U.S. PATENT DOCUMENTS

| | | | |
|---|---|---|---|
| 8,712,732 B2 | 4/2014 | Patel et al. | |
| 2010/0201720 A1* | 8/2010 | Zampini, II | G06Q 30/0241 345/690 |
| 2010/0259178 A1* | 10/2010 | Kalapodas | H05B 33/0818 315/210 |
| 2011/0026547 A1* | 2/2011 | Yokota | G03F 7/70008 372/18 |
| 2011/0187387 A1 | 8/2011 | Deniau et al. | |
| 2014/0253032 A1 | 9/2014 | Bruwer et al. | |
| 2015/0233998 A1 | 8/2015 | Chen et al. | |

FOREIGN PATENT DOCUMENTS

| | | |
|---|---|---|
| WO | 2013040497 A2 | 3/2013 |
| WO | 2014134637 A2 | 9/2014 |

OTHER PUBLICATIONS

"Written Opinion", dated Feb. 27, 2013 for PCT Application No. PCT/US2012/055632.
Cohn, et at., "Your noise is my command: Sensing gestures using the body as art antenna", Microsoft Research, May 2011, pp. 791-800.
Borg, et al., "Applications of Plasma Columns to Radiofrequency Antennas", Applied Physics Letters, 74(22), pp. 3272-3274 (May 1999).
Chen, et al., "Bathroom Activity Monitoring Based on Sound," in Pervasive Computing (Pervasive 2005), vol. 3468 of the series Lecture Notes in Computer Science, pp. 47-61 (May 2005).
Cooley, et al., "A Fluorescent Lamp with Integral Proximity Sensor for Building Energy Management," 2007 IEEE Power Electronics Specialists Conference, pp. 1157-1163 (Jun. 2007).
Dietz, et al., "Very Low Cost Sensing and Communication Using Bidirectional LEDS", in UbiComp 2003: Ubiquitous Computing, vol. 2864 of the series Lecture Notes in Computer Science, pp. 175-191 (Oct. 2003).
Echtler, et al., "An LED-based Multitouch Sensor for LCD Screens", TEI, Jan. 2010, 4 pages.
Fogarty, et al., "Sensing from the Basement: A Feasibility Study of Unobtrusive and Low-Cost Home Activity Recognition," Proceedings of the 19th Annual ACM Symposium on User Interface Software and Technology (UIST '06), pp. 91-100 (Oct. 2006).
Froelich, et al., "HydroSense: Infrastructure-Mediated Single-Point Sensing of Whole-Home Water Activity," Proceedings of the 11th International Conference on Ubiquitous Computing (UbiComp '09), pp. 235-244 (Sep. 2009).
Fukumoto, et al., "Body Coupled FingeRing: Wireless Wearable Keyboard," Proceedings of the ACM SIGCHI Conference on Human Factors in Computing Systems (CHI '97), pp. 147-154 (Mar. 1997).
Gupta, et al., "ElectriSense: Single-Point Sensing Using EMI for Electrical Event Detection and Classification in the Home," Proceedings of the 12th ACM International Conference on Ubiquitous Computing (UbiComp '10), pp. 139-148 (Sep. 2010).
Gupta, et al., "LightWave: Using Compact Fluorescent Lights as Sensors," in Proceedings of the 13th ACM International Conference on Ubiquitous Computing (UbiComp'11), pp. 65-74 (Sep. 2011).
Harrison, et al., "Skinput: Appropriating the Body as an Input Surface," Proceedings of the SIGCHI Conference on Human Factors in Computing Systems (CHI '10), pp. 453-462 (Apr. 2010).
Hodges, et al., "ThinSight: Versatile Multi-touch Sensing for Thin Form-factor Displays", Proc. of UIST, Oct. 2007, 10 pages.
Kim, et al., "The Gesture Watch: A Wireless Contact-free Gesture Based Wrist Interface," 2007 11th IEEE International Symposium on Wearable Computers, pp. 15-22 (Oct. 2007).
Kim, et al., ViridiScope: Design and Implementation of a Fine Grained Power Monitoring System for Homes, Proceedings of the 11th International Conference on Ubiquitous Computing (UbiComp '09), pp. 245-254 (Sep. 2009).
Ma, Michelle, "Battery-Free Technology Brings Gesture Recognition to All Devices," Univ. of Wash. Today, 7 pages (Feb. 2014).
Microchip Technology Inc. "GestIC® Technology Press Introduction," pp. 1-17 (Nov. 2012).
Moeller, et al., "ZeroTouch: An Optical Multi-Touch and Free-Air Interaction Architecture", CHI, Session: Dimensions of Sensory Interaction, May 2012, 10 pages.
Paradiso, et al., "EMI Spy: Harnessing Electromagnetic Interference for Low-Cost, Rapid Prototyping of Proxemic Interaction," available online at: https://web.archive.org/web/20141101004423/http://web.media.mit.edu/~nanzhao/webfiles/emi/emi.html, 1 page, (* 2014).
Patel, et al., "At the Flick of a Switch: Detecting and Classifying Unique Electrical Events on the Residential Power Line," In UbiComp 2007: Ubiquitous Computing, vol. 4717 of the series Lecture Notes in Computer Science, pp. 271-288 (Sep. 2007).
Patel, et al., "Detecting Human Movement by Differential Air Pressure Sensing in HVAC System Ductwork: An Exploration in Infrastructure Mediated Sensing," In Pervasive Computing, vol. 5013 of the series Lecture Notes in Computer Science, pp. 1-18 (May 2008).
Rekimoto, "SmartSkin: An Infrastructure for Freehand Manipulation on Interactive Surfaces", Proc. CHI, Apr. 2002, 8 pages.
Saponas, et al., "Enabling Always-Available Input with Muscle-Computer Interfaces," Proceedings of the 22nd Annual ACM Symposium on User Interface Software and Technology (UIST '09), pp. 167-176 (Oct. 2009).
Smith, et al., "Electric Field Sensing for Graphical Interfaces," IEEE Computer Graphics and Applications, 18(3), pp. 54-60 (May/Jun. 1998).
Smith, "Field Mice: Extracting Hand Geometry from Electric Field Measurements," IBM Systems Journal, 35(3.4), pp. 587-608 (* 1996).
Zhao, et al., "EMI Spy: Harnessing Electromagnetic Interference for Low-Cost, Rapid Prototyping of Proxemic Interaction," IEEE Conference on Body Sensor Networks (BSN), Cambridge, MA, pp. 1-6 (Jun. 2015).
Zimmerman, et al., "Applying Electric Field Sensing to Human-Computer Interfaces," Proceedings of the SIGCHI Conference on Human Factors in Computing Systems (CHI '95), pp. 280-287 (May 1995).

* cited by examiner

SYSTEMS AND METHODS FOR SENSING ENVIRONMENTAL CHANGES USING LIGHT SOURCES AS SENSORS

CROSS-REFERENCE TO RELATED APPLICATION(S)

This application claims priority to U.S. Provisional Application No. 61/535,153, filed Sep. 15, 2011, which application is incorporated herein by reference, in its entirety, for any purpose.

TECHNICAL FIELD

Embodiments of the present invention relate generally to sensing environmental changes using electromagnetic interference signals, for example on a power line, and examples described include sensing proximity, temperature, or other environmental changes using a light source (e.g., a compact fluorescent light bulb) as a sensor.

BACKGROUND

Many sensing approaches allow environmental changes to be sensed at or near a device. The use of motion sensors and photosensors, for instance, may allow motion and light to be measured, respectively, while other approaches may be directed to sensing other types of environmental changes, such as gestures. One manner in which gestures may be measured involves the use of capacitive sensing, where capacitance of the human body is sensed and/or measured by a dedicated capacitive sensor. In this manner, proximity, position, and acceleration of a person may all be measured.

Various approaches for sensing environmental changes in home environments have been developed, but providing an unobtrusive, low-cost, and/or low-maintenance solution has proven difficult. In some approaches, for example, systems rely on use of cameras to sense environmental changes, but are limited in that environmental changes may only be sensed in a camera's line of sight. Other approaches have relied on touch sensors and/or requiring a device to be worn, however, these approaches have also been problematic. Touch sensors require a relatively high number of sensors, which can result in expensive and time-consuming installation costs as well as difficult maintenance, and requiring a device to be worn in a home environment is often impractical.

SUMMARY

The summary is provided here by way of example and is not intended to limit the scope of any of the described examples or claims.

Examples of the present invention include methods. An example method may include illuminating a space with a light source. The light source may include an internal oscillator used during the illuminating. The method may further include sensing an environmental change with the light source based, at least in part, on a change in operation of the internal oscillator.

Some example methods may also include receiving an electromagnetic interference signal from the light source, sampling the electromagnetic interference signal to generate a set of environmental data, and analyzing the set of environmental data to identify the environmental change.

In some examples, the light source may include a bulb having a ballast, a switching power supply, or a combination thereof.

In some examples, analyzing the set of environmental data may include determining whether the environmental change includes motion relative to the bulb, a touch of the bulb, a hover near the bulb, a touch of a lamp of the bulb, a temperature variation, or a combination thereof.

In some examples, the electromagnetic interference signal may be received over a power network. In some examples, the electromagnetic interference signal may be received within the light source.

In some examples, variations in a fundamental frequency of the electromagnetic interference signal may be identified to analyze the set of environmental data.

Examples of the present invention further include systems, such as electromagnetic interference monitoring systems. An example system may include a power network interface configured to receive an electromagnetic interference signal over a power network from a light source operating in accordance with an oscillator signal, and at least one processing unit and at least one computer readable medium encoded with instructions that, when executed, cause the at least one processing unit to process the electromagnetic interference signal, and sense an environmental change based on a variation in the processed electromagnetic interference signal according to one or more criteria, wherein the environmental change caused the variation in the electromagnetic interference signal.

In some examples, the power network interface may be configured to receive the electromagnetic interference signal over a power network using inductive coupling.

In some examples, the electromagnetic interference signal may include a fundamental frequency and a plurality of harmonic frequencies.

The light source may in some examples include a bulb having a ballast, a bulb having a switching power supply, or a combination thereof.

Example systems may include a transform component configured to convert the electromagnetic interference signal to the frequency domain, a frequency detector component configured to identify one or more frequencies of the electromagnetic interference signal and sum the one or more frequencies of the electromagnetic interference signal over time, and a filter configured to smooth the summed electromagnetic interference signal.

In some examples, the environmental change may include a gesture, a temperature variation, or a combination thereof. The gesture may include motion relative to the light source, a touch of the light source, a hover near the light source, a touch of the light source housing, or a combination thereof.

Examples of criteria that may be used to sense an environmental change based on a variation in the processed electromagnetic interference signal include rates of change, magnitude, and combinations thereof.

In some example systems, the instructions further cause the at least one processing unit to monitor a frequency range comprising a fundamental frequency of the electromagnetic interference signal.

Another example method may include monitoring a plurality of frequency ranges on a power network, receiving an electromagnetic interference signal having a fundamental frequency within one of the plurality of frequency ranges, processing the electromagnetic interference signal, and after processing the electromagnetic interference signal, sensing environmental changes based, at least in part, on one or more variations of the electromagnetic interference signal.

In some examples, monitoring the plurality of frequency ranges may include rejecting a power signal on the power network. In some examples, each of the plurality of frequency ranges corresponds to a respective light source. One of the respective light sources may include a bulb having a ballast, a switching power supply, or a combination thereof.

Example methods may include calibrating with a light source, and responsive to the calibrating, monitoring the one of the plurality of frequency ranges. In some examples, calibrating with the light source may include detecting a presence of the electromagnetic interference signal on the power network.

In some examples, processing the electromagnetic interference signal may include converting the electromagnetic interference signal to a frequency domain, identifying one or more frequencies of the electromagnetic interference signal, summing the one or more frequencies of the electromagnetic interference signal for each of a plurality of vectors in time, and filtering the electromagnetic interference signal.

DETAILED DESCRIPTION

Systems and methods for sensing environmental changes using light sources as sensors are disclosed herein. The light source may serve as a sensor in some examples by detecting changes in electromagnetic interference signals generated by the light source due to an environmental change, such as proximity of a person to the light source, motion proximate the light source, a gesture proximate the light source, or a temperature change proximate the light source. In accordance with one or more embodiments of the invention, environmental changes at or near a light source may be sensed based on variations in electromagnetic interference signals, which may be detected on a power line. Certain details are set forth below to provide a sufficient understanding of embodiments of the invention. However, it will be clear to one having skill in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Examples described herein utilize electromagnetic interference (EMI) signals. EMI signals may generally be one of two types, transient or continuous. Transient EMI signals may be characterized by a short duration for which the signal may be observed. Typically, these signals may only be measured for up to a few milliseconds. On the other hand, continuous EMI signals can be observed so long as the source of the EMI signal is operating. A compact fluorescent light (CFL) bulb, for instance, may generate a continuous EMI signal that may be measured so long as the bulb is turned on. EMI signals generated by a device may be observable on a power line to which the device is coupled. Continuous EMI signals may result from operation of many electric and/or electronic devices, such as power supplies, transformers, ballasts, and electric motors. Generally, any device configured to generate EMI signals may be used to sense environmental changes described herein. Examples of suitable devices include light sources such as, but not limited to, fluorescent lights or LED lights. Other examples of suitable devices include devices having an internal oscillator. The internal oscillator may generate EMI signals during operation of the device which may be observed (e.g., detected) as described herein. EMI signals generated by devices described herein may typically include frequencies that are harmonically related to one or more operating frequencies of the device, such as the frequency of the internal oscillator used by the device.

Figure 1:
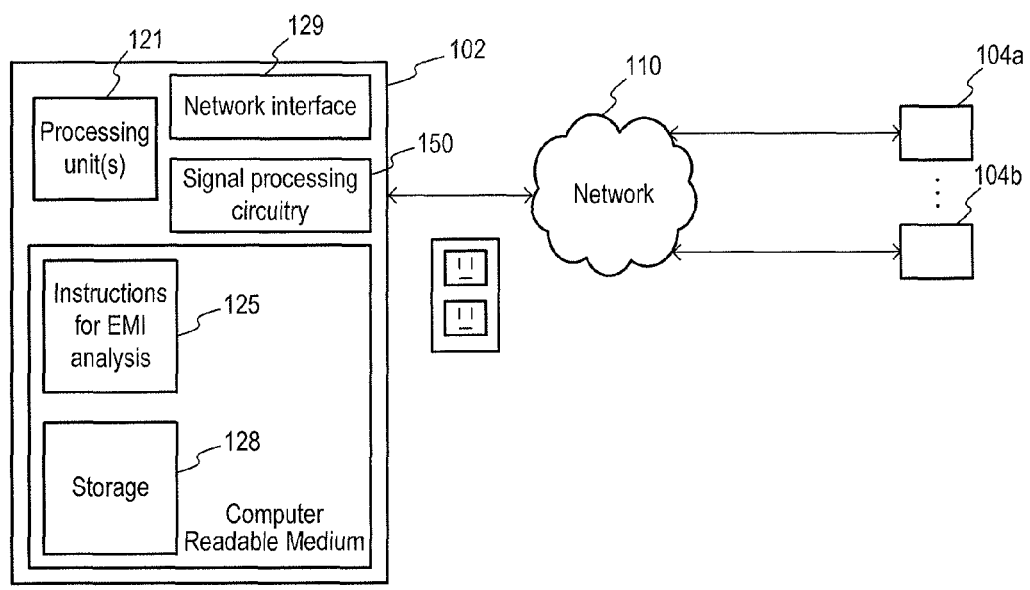
FIG. 1 is a schematic illustration of an electromagnetic interference monitoring system according to an embodiment of the invention.

FIG. 1 is a schematic illustration of an electromagnetic interference (EMI) monitoring system 100 according to an embodiment of the invention. The electromagnetic interference monitoring system 100 may include an EMI monitoring system 102, one or more light sources 104, and a network 110.

Each of the light sources 104 (e.g., 104a-n) may be an electric and/or electronic device (e.g., light-emitting device) that may illuminate a space at or near the light source 104. Each light source 104 may provide electromagnetic interference signals on the network 110 during operation of the light source 104a-n, and/or during an environmental change occurring in a proximity of the light source 104a-n. The electromagnetic interference may be provided, for example, by operation of an internal oscillator used to operate the light source. Suitable light sources include, but are not limited to, light sources having internal oscillators, such as a light bulb having a ballast and/or switching power supply (including a compact fluorescent light bulb, a fluorescent light bulb, a high-intensity discharge bulb, and/or a light emitting diode (LED)), or any combination thereof. Each of the light sources 104a-n may provide an EMI signal during operation and/or during an environmental change occurring in a vicinity of the light source 104, and EMI signals provided in this manner may vary in frequency and/or be related to impedance of a circuit and/or a switching frequency of transistors included in a light source light source 104a-n. Each EMI signal provided by light sources 104a-n may include one or more unique noise patterns (e.g., frequencies) by which the signal may be differentiated from other EMI signals. This may, for example, allow the light sources 104a-n to be identified by their respective EMI signals. For example, the electromagnetic interference monitoring system 102 may identify one or more of the light sources 104a-n by recognizing the EMI signal particular to one of the light sources 104 occurring on the network 110, which may be a power network. As will be explained in more detail below, one or more variations of an EMI signal provided by the light sources 104a-n may be identified to sense an environmental change. In one embodiment, for example, variations in the harmonic components of the EMI signal may indicate a gesture and/or temperature variation at a light source 104a-n.

In some embodiments, one or more of the light sources 104a-n may include an internal oscillator and the light source 104a-n may operate in accordance with an oscillator signal. The EMI signal provided by a light source 104a-n may relate to the frequency of the oscillator signal used in the light source 104a-n. Oscillators of the light sources 104 may be any oscillators known in the art, now or in the future, including but not limited to crystal oscillators, LC resonant oscillators, or microprocessor-based oscillators.

Each of the light sources 104 may be in electrical communication with (e.g., coupled to) the network 110, which may be a power network, and any number of light sources coupled to the power network 110, including, but not limited to, the other components of the EMI monitoring system 100 described below. Any number of light sources 104a-n may be provided in the system 100, including 1 light source. The network 110 may be a power network having any topology or infrastructure, and may, for instance, be a residential power network or a commercial power network. The power network 110 may, for example, include conductors, switches, circuit breakers, fuses, transformers, triacs, converters (e.g., AC-DC converters), panels, generators, controllers, or any combination thereof. The power network 110 may receive power from a power grid (not shown), and may provide power to one or more light sources 104 in electrical communication with the power network 110.

Each of the light sources 104 may further be in electrical communication with an EMI monitoring system 102 through the power network 110. Both the light sources 104a-n and the EMI monitoring system 102 may be coupled at any point to the power network 110. In some embodiments, for example, the EMI monitoring system 102 and/or one or more of the light sources 104 may be coupled to the power network 110 at an outlet or circuit breaker. The EMI monitoring system 102 may include a power network interface, such as an interface to an outlet, a circuit breaker, or combinations thereof, that may be suitable for receiving the EMI signals provided over the power network 110. In some embodiments, power network interface may receive the EMI signals provided over the power network 110 using inductive coupling, for instance, with a current transformer. Accordingly, the power network interface may be coupled to the power line inductively and may not need to be physically installed into the power network in some examples. The EMI monitoring system 102 may be configured to receive one or more EMI signals from each of the light sources 104 through the power network 110. Accordingly, the EMI monitoring system 102 may be located in one location, e.g. an outlet, circuit breaker, or other location, while the light sources 104a-n may be located at a different location, e.g., throughout a residential home. This may allow for centralized monitoring of environmental changes using EMI signals produced by one or more of the light sources 104a-n. In some examples, the EMI monitoring system 102 may be co-located with one or more of the light sources 104a-n. For example, all or portions of the EMI monitoring system 102 may be integrated with one or more of the light sources 104a-n.

The EMI monitoring system 102 may include one or more processing units 121 and computer readable media 123. Herein, the term computer readable media is used to refer to a single computer readable medium in some embodiments, and in other embodiments multiple computer readable media in communication with one or more processing units, such as the processing units 121. The processing units 121 may be implemented using one or more processors, or other hardware capable of performing the functions described herein. The computer readable media 123 may store executable instructions for an electromagnetic interference analysis engine 125. The computer readable media 123 may also include a storage 128. The executable instructions for an electromagnetic interference analysis engine 125 may include instructions for analyzing and/or processing one or more EMI signals received from the one or more light sources 104, further examples of which are provided below. Although the executable instructions for the electromagnetic interference analysis engine 125 are shown on a same computer readable media 123, in some embodiments any or all sets of instructions may be provided on multiple computer readable media and may not be resident on the same media. Accordingly, computer readable media 123 as used herein includes one or more computer readable media 123. Computer readable media 123 and/or storage 128 may include any form of computer readable storage or computer readable memory, transitory or non-transitory. Non-transitory, physical, and/or tangible computer readable media include, but are not limited to, externally or internally attached hard disk drives, solid-state storage (such as, but not limited to, NAND flash or NOR flash media), tiered storage solutions, storage area networks, network attached storage, and/or optical storage.

As described, the instructions stored on the computer readable media 123 may be executed by the one or more processing units 121 or other processing units. The executable instructions for the electromagnetic interference analysis 125 may be referred to as an "EMI engine" herein, where the EMI engine refers to the executable instructions for an electromagnetic interference analysis engine 125 executed by the one or more of the processing units 121 or other processing units.

The EMI monitoring system 120 may further include signal processing circuitry 150, which may include, for example, analog-to-digital converters, filters, or other circuits for performing functions described herein. The division of responsibilities between the processing unit(s) 121 operating in accordance with the instructions 125 and the circuitry 150 may be flexible such that examples of the present invention may be implemented in hardware, software, or combinations thereof.

The EMI monitoring system 102 may further include any number of input and output components such as, but not limited to, keyboards, mice, touch screens, network interfaces, or combinations thereof. Accordingly, the EMI monitoring system 102 may be implemented using generally any computing system or controller programmed to perform the functions described herein, e.g. EMI analysis for sensing of environmental changes.

During operation, a light source 104 may provide an EMI signal to the power network 110, and the EMI analysis engine of the EMI monitoring system 102 may receive the EMI signal. In some instances, multiple light sources 104 may operate at a same time, and accordingly, the EMI monitoring system 102 may differentiate between the EMI signals. In one embodiment, the EMI monitoring system 102 may differentiate between EMI signals after being calibrated with one or more of the light sources 104. As will be explained in more detail below, calibrating with a light source 104 may for instance, cause the EMI analysis engine to monitor a respective frequency range for a light source 104. By way of example, a light source 104 may be enabled (e.g., turned on) and disabled (e.g., turned off) one or more times. By detecting the presence and/or absence of an EMI signal in response to the light source 104 being enabled and/or disabled, the EMI analysis engine of the EMI monitoring server 102 may identify a frequency or frequency range corresponding to the EMI signal of the light source 104. Particular frequencies and/or durations of EMI signals expected for each of the light sources 104*a-n* may in some examples be stored in a location accessible to the EMI monitoring system 102, e.g., in the storage 128 or other location. In some instances, the EMI analysis engine may require that a light source is enabled and/or disabled multiple times to ensure that the EMI analysis engine may properly identify the EMI signal of a light source 104. In another embodiment, one or more light sources 104 may be configured to provide an EMI signal having a known frequency. Frequency ranges may be provided to the EMI monitoring server 102 to define a frequency range at which the EMI signal of a light source 104 is monitored, and may be provided to the EMI monitoring server 102 manually by a user and/or may be received over a communications network, such as the Internet. In yet another embodiment, the EMI monitoring server may be configured to identify EMI signals and automatically identify a range at which to monitor a light source 104. It will be appreciated by those having ordinary skill in the art that other implementations may be made without departing from the scope and spirit of the invention.

The EMI monitoring system 102 may be in communication with any number of other computing systems, so for example, the EMI monitoring system 102 may be plugged into an outlet in a home on a power network with light sources of interest. The EMI monitoring system 102 may sense environmental changes as described herein, and may provide information regarding the sensed environmental change to another computing system which may be used, for example, by an administrator or other user (e.g., an individual or another computer process) to receive notifications of environmental changes and/or to observe environmental change patterns.

Environmental changes that may be sensed in accordance with embodiments of the present invention include, but are not limited to, motion, a hover of a user hand near a light source, a user touching a light source, a user touching a light source housing (e.g., bulb itself, shade, or stand), other gestures, temperature changes, proximity changes, or combinations thereof.

Figure 2:
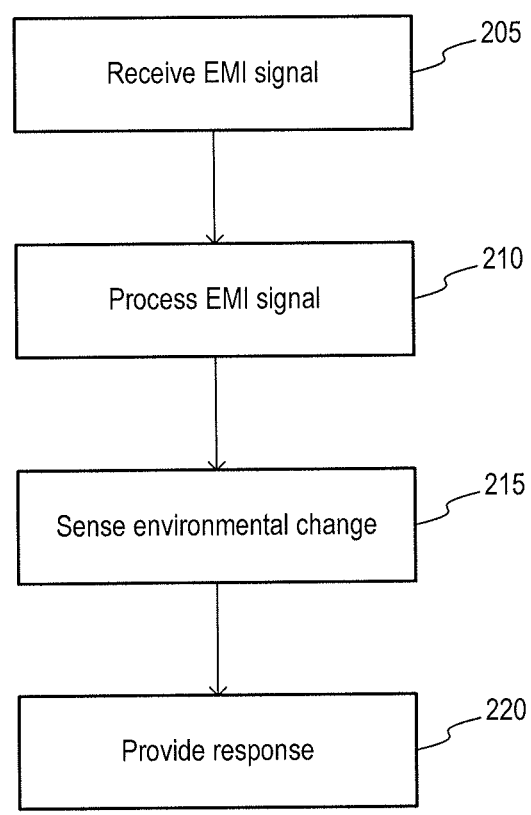
FIG. 2 is a flow chart of a method for sensing an environmental change according to an embodiment of the invention.

FIG. 2 is a flow chart of a method 200 for sensing an environmental change according to an embodiment of the invention. The method 200 may be implemented by the EMI monitoring system 102 of FIG. 1, and in some examples, the instructions 125 may include instructions for performing all or portions of the method 200. While the method 200 is described with respect to sensing environmental changes using an individual EMI signal, it will be appreciated by those having ordinary skill in the art that environmental changes may be sensed using multiple EMI signals simultaneously.

At a step 205, the EMI analysis engine of the EMI monitoring server 102 may receive an EMI signal from a light source 104, for instance, over the power network 110. The EMI signal may include a plurality of harmonic components, including a fundamental frequency and a plurality of harmonic frequencies. Both the fundamental frequency and the plurality of harmonic frequencies of the EMI signal may relate to an operating frequency of the light source 104, such as a frequency of an oscillator signal. The plurality of harmonic frequencies may include even and odd harmonic frequencies, each of which may have a frequency that is an integer multiple of the fundamental frequency.

As will be described in more detail below, once the EMI analysis engine has received the EMI signal, the EMI analysis engine may process the EMI signal at a step 210. Processing the EMI signal with the EMI analysis engine may include generating a set of environmental data based on the EMI signal. The EMI analysis engine may manipulate the environmental data, for instance, by truncating, filtering, and/or formatting the data. The EMI analysis engine may process the EMI signal in real-time, process the EMI signal periodically, or a combination thereof. Processing the EMI signal at step 210 may include identifying an EMI signature of a particular light source. The EMI signature may be detected based on presence of an EMI signal at a particular frequency At a step 215, the EMI analysis engine may use the processed EMI signal to sense environmental changes. Environmental changes may be sensed by identifying variations in an EMI signature which correspond with a particular environmental change. For example, a model regarding changes in the EMI signature caused by an environmental change may be stored in a location accessible to or otherwise known by an EMI monitoring system described herein. When the EMI signature changes in the manner specified by the model, the environmental change may be sensed. Sensed environmental changes may be identified based on one or more variations in one or more frequencies of an EMI signal, and may correspond, for example, to gestures. Gestures may include a person touching one or more parts of a light source 104, moving relative to a light source 104, and/or hovering near a light source 104. Touching a light source 104 may include touching a shade, stand, or bulb of a lamp, and hovering may include a person being within a determinable distance of a light source 104.

In some examples, the variations in EMI signature caused by environmental changes may be quite small, and accordingly signal processing techniques described herein may be employed to reliably analyze the small changes in EMI signature and thereby sense environmental changes.

Motion, touching, and hovering environmental changes may be sensed in a same manner. Variations in an EMI signal may indicate a proximity of a person and/or the manner of a gesture. In one embodiment, for example, motion, touching and/or hovering may cause the amplitude of the EMI signal to vary (e.g., increase), the fundamental frequency of the EMI signal to shift, and/or the energy of various harmonic frequencies of the EMI signal to be redistributed. These signal variations may result from disruption of an electric field emitted by a light source 104, which may in turn result from the impedance of a person near a light source 104. The additional impedance may cause an equilibrium of an oscillator to become imbalanced, ultimately resulting in variations in the EMI signal provided by the light source 104.

The magnitude of variations of an EMI signal may be used by an EMI analysis engine to identify particular gestures. By way of example, lesser variations may correspond to hovers and greater variations may correspond to touches. With respect to a CFL bulb, variations in the EMI signal may be used to sense motion, hover and touch environmental changes and in some embodiments may be used to determine the proximity of a person to the bulb, the amount a person is touching the bulb, and/or whether a person is touching a portion of the lamp of the CFL bulb, such as the lamp shade or base.

Additionally or alternatively, the EMI analysis engine may sense other environmental changes as well. For example, indication of a failure of a light source 104 or temperature variations at a light source 104 may also be sensed. In particular, shifts in the fundamental frequency of an EMI signal may indicate a temperature variation, and in one embodiment, increases in temperature may cause the fundamental frequency of an EMI signal to decrease, and decreases in temperature may cause the fundamental frequency of an EMI signal increase. Variations in temperature at a light source 104 may cause the fundamental frequency of a light source 104 to increase or decrease as much as 100 kHz.

The EMI analysis engine may analyze the processed EMI signal to identify instances at which one or more frequencies of the EMI signal exceeds one or more thresholds, and such instances satisfying one or more predetermined criteria may be identified as environmental changes. In at least one embodiment, environmental changes may be sensed based on a rate of change and/or a magnitude of the EMI signal. For example, in at least one embodiment, an environmental change may only be identified if the energy of a harmonic component of an EMI signal increases at least at a particular rate and subsequently decreases at least at the same particular rate or at least at a different rate. Sensing an environmental change may further require that the increase and decrease of the EMI signal take place within a particular amount of time. In at least one embodiment, processed EMI signals may be analyzed using a moving window derivative filter (e.g., first order derivative filter) such that only a portion of generated data is analyzed at a time and/or the most current environmental data is analyzed, allowing the EMI analysis engine to operate in real time. Thresholds and/or signal characteristics used to identify an environmental change may be stored in a location accessible to the EMI monitoring system 102 of FIG. 1, for example in the storage 128 or other location.

Sensing environmental changes in this manner may prevent improper segmentation of environmental changes in some examples. For example, if a person moves near a light source 104, an increase in the summed energy of an EMI signal may be detected, and if the person moves away from the light source 104, a decrease in the summed energy of EMI signal may be detected. Requiring both the increase and decrease of the summed energy of the EMI signal before an environmental changes is sensed may assure that a gesture is treated as a single environmental change. Accordingly, the instructions for EMI analysis 125 may include instructions for determining whether motion has occurred by detecting an increase of summed EMI above a threshold followed by a decrease in summed EMI above a threshold. In other embodiments, environmental changes may be sensed using different segmentation criteria. For instance, with reference to the aforementioned example, the increase and decrease of the summed energy of the EMI signal may be treated as separate respective environmental changes. It will be appreciated by those having ordinary skill in the art that other implementations may be used without departing from the scope and spirit of the invention.

In some embodiments, whether variations of an EMI signal are environmental changes may further be determined using models. Models may provide a framework by which the EMI analysis engine determines which variations in an EMI signal are separate environmental changes, a single environmental change, or no environmental change. For example, one or more light sources 104 may demonstrate different variations in their respective EMI signals in response to one or more same environmental changes. Use of models may allow the EMI analysis engine to interpret data in a manner that is appropriate for a particular light source 104. Models may be provided to the EMI monitoring server 102 by a user using a portable media device (e.g., flash drive) or may be acquired over a communications network (e.g., Internet), for instance, from a cloud-based database. Each model may be stored in the storage 128 in some examples, or in another storage location accessible to the EMI monitoring system 102. In some embodiments, models may further indicate a frequency range by a particular light source 104 may be monitored, as described above.

After sensing one or more environmental changes in the manner described herein, the EMI monitoring system 102 may provide a response at a step 220. In an example where a light source 104 includes a CFL lamp, for example, a person may be sensed near the lamp based on an increase in EMI energy attributable to the lamp. Responsive to the person moving away from the light source, the EMI monitoring system 102 may disable (e.g., turn off) the light source 104. In another example, a temperature change may be sensed and in response the EMI monitoring server 102 may enable and/or disable a light source, such as an air conditioner or heater. In other examples, the response provided in step 220 may be to provide an indicator, e.g., an indication on a display or a communication over a network or other interface, that an environmental change has been sensed.

Thus, EMI signals, and variations in EMI signals, may be used to sense environmental changes at or near a light source 104. Briefly, EMI signals may be received by the EMI analysis engine of the EMI monitoring server 102, processed, and used to sense environmental changes, as described above. Because environmental changes may be sensed in this manner, embodiments of the invention described herein may be implemented with any existing light source configured to provide an EMI signal over a power network, such as any known CFL bulb.

In some embodiments, modified light sources 104 may be used in the EMI monitoring system 100 as well. As an example, a CFL bulb may be modified with a sensor (e.g., ultrasonic sensor) by which gestures may be sensed at a greater distance than with a CFL bulb having no sensor. In other embodiments, light sources 104 may be configured to sense environmental changes and/or provide signals indicating environmental changes have been sensed. In one embodiment, for instance, an EMI monitoring system may be included in a light source and may receive EMI signals within the light source.

Figure 3A:
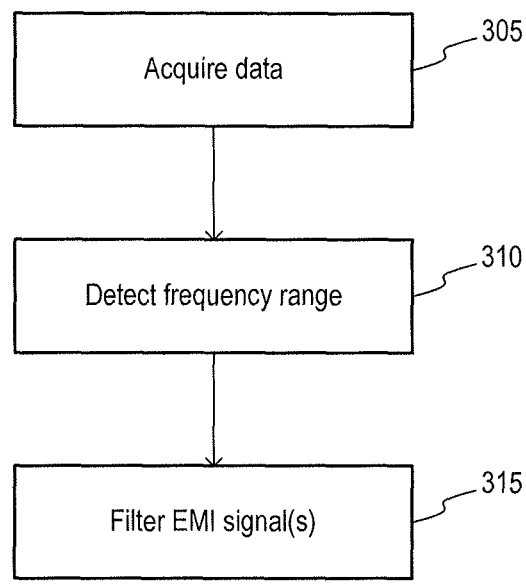
FIG. 3A is a flow chart of a method for processing an electromagnetic interference signal according to an embodiment of the invention.

FIG. 3A is a flow chart of a method 300 for processing an electromagnetic interference signal according to an embodiment of the invention. The method 300 may be used to implement the step 210 of FIG. 2, and may be utilized by the EMI analysis engine of the EMI monitoring system 102 of FIG. 1. The instructions 125 may include instructions for performing some or all of the method 300.

At a step 305, the EMI analysis engine may acquire data corresponding to a EMI signal, such as an EMI signal received at the step 205 of FIG. 2. In one embodiment, the EMI analysis engine may convert an EMI signal into a set of environmental data, for instance, by sampling the EMI signal at a particular rate. Because one or more power signals and the EMI signal may be provided over the power network 110 simultaneously, a filter (e.g., high-pass filter) may be used to reject the one or more power signals such that the EMI signal may be properly sampled. The environmental data may be transformed using a fast Fourier transform (FFT), or other discrete Fourier transform, to transform the sampled EMI signal to the frequency domain. The decibel magnitude of each vector resulting from the transform may be determined and any redundant vectors may be discarded. Outlier vectors, such as those having a magnitude exceeding a predetermined threshold may also be discarded.

At a step 310, the EMI analysis engine may identify frequencies for an EMI signal using the transformed environmental data. As described, the EMI analysis engine may monitor a light source 104 at a respective frequency range. Monitoring a frequency range in this manner may allow the EMI analysis engine to monitor several light sources 104 simultaneously while still reducing aggregate noise from other sources. In monitoring an EMI signal, the EMI analysis engine may identify the fundamental and harmonic frequencies of an EMI signal.

Once the fundamental and harmonic frequencies are identified, a sum of the entire band of the $3^{rd}$ harmonic frequency may be determined for each FFT vector in time. By determining a sum of energies, variations of the $3^{rd}$ harmonic frequency due to temperature variations at the light source 104 may be ignored. While this step has been described with respect to summing a $3^{rd}$ harmonic frequency, it will be appreciated that other frequencies may be summed in addition to or in lieu of the $3^{rd}$ harmonic frequency. For example, in one embodiment, the EMI analysis engine may additionally or alternatively sum other odd-harmonic frequencies, such as a $5^{th}$ and/or a $7^{th}$ harmonic frequency.

The EMI analysis engine may subsequently filter the summed harmonic(s) to improve signal quality at a step 315. This may, for instance, remove noise in the signal resulting from EMI signals of other light sources 104 and/or decrease overall volatile variation in the signal. The summed harmonic may be filtered using one or more filters during one or more passes, including any filter known in the art, now or in the future, such as Gaussian, FIR, and/or Savitzky-Golay filters. Once the filtering process has completed, the resulting data may be analyzed for sensing environmental changes, as described above with respect to step 215 of FIG. 2.

Variations in EMI signals may be used to sense environmental changes, such as gestures and temperature changes, each of which may be sensed using different types of variations in EMI signals. While the method 300 may be directed with respect to sensing human gestures with one or more light sources 104, in other embodiments, temperature variation may be sensed, for instance, by identifying variations (e.g., shifts) in a fundamental frequency of an EMI signal. In some embodiments, an EMI signal may be processed and/or analyzed to sense gestures or to sense temperature, or may be processed and/or analyzed to sense both gestures and temperature.

Figure 3B:
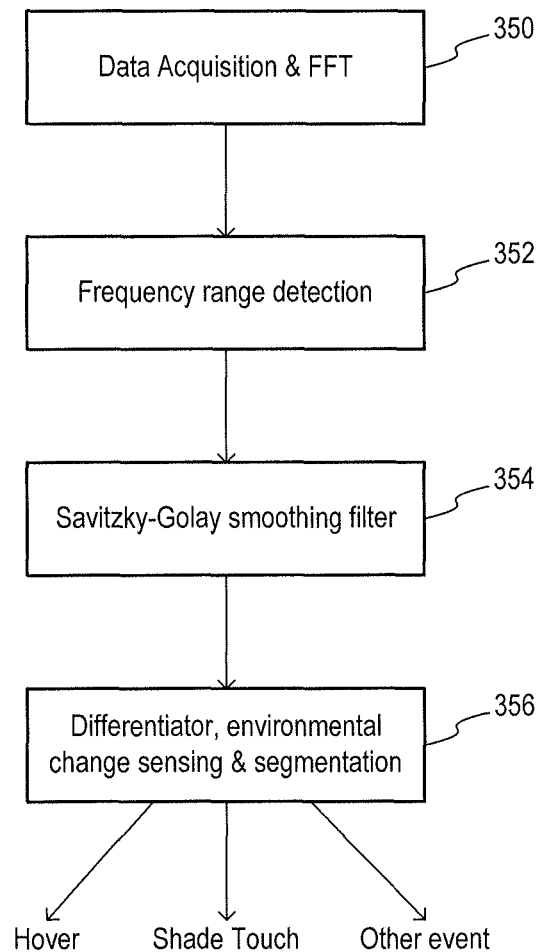
FIG. 3B is a block diagram of signal processing components that may be used to sense environmental changes in accordance with embodiments of the present invention.

FIG. 3B is a block diagram of signal processing components that may be used to sense environmental changes in accordance with embodiments of the present invention. The signal processing circuitry 150 of FIG. 1 may include the components shown in FIG. 3B and/or the instructions 125 of FIG. 1 may include instructions for performing the function of the components in FIG. 3B in some examples when one or more of the components in FIG. 3B is implemented in software.

A data acquisition and FFT component 350 is provided for receipt of electromagnetic interference on a power line. The data acquisition and FFT component 350 may include sampling circuitry which may sample a power line voltage at an appropriate frequency. Circuitry may also be included which may reject a frequency on the power line that is used to power electrical devices, e.g., 60 Hz in the U.S., 50 Hz in Europe or Asia. The sampled signal may be digitized and transformed by the data acquisition and FFT component using, for example, a Fast Fourier Transform (FFT) to provide a number of vectors corresponding to the sampled signal. A magnitude of each vector may be provided to a next component, the frequency range detector 352.

The frequency range detector 352 may identify fundamental and/or harmonic frequencies of the EMI signature of a light source. The frequency range detector 352 may be programmed with and/or may access a stored representation of the fundamental and/or harmonic frequencies corresponding to the EMI signature of each light source in a an example system. These characteristics may be known by provided models or other data, or may be determined by the system during, for example, a calibration procedure (e.g., turning the light source on and off a number of times and recording the fundamental and harmonic frequencies generated by turning the light source on and off). Frequency ranges for each light source in a system employing the signal processing components of FIG. 3B may be monitored. The frequency range detector 352 may further sum energies across a band corresponding to multiple of a light source's harmonics. Accordingly, the frequency range detector 352 may sum energies including the $1^{st}$ through $3^{rd}$ harmonics of an EMI signature for each light source being monitored, in some examples. Other ranges of harmonics may also be used, including $1^{st}$ through $5^{th}$ harmonics and $1^{st}$ through $7^{th}$ harmonics in other examples. Accordingly the frequency range detector 352 may provide an output of summed energy over time corresponding to the frequency ranges associated with the EMI signatures of one or more light sources in the system.

Human proximity or gestures may increase the energy contained in these EMI signatures, as described herein. Accordingly, the summed energy signal may rise responsive to an environmental change such as a gesture. The summed energy signal, however, may be noisy due in part to factors such as noise from other appliances or other broadband noise. Accordingly, in some examples, environmental changes may not be sensed based on a sum of energy in a range of harmonics associated with the EMI signature of a light source. Instead, the summed signal may be smoothed in some examples.

A smoothing filter 354 may accordingly be provided to smooth the summed energy signal provided by the frequency range detector 352. The smoothing filter may be implemented using, for example, an averaging FIR filter or a moving window Gaussian smoothing filter, but these may smooth out the environmental change itself, making it difficult to detect. In some examples, a Savitzky-Golay smoothing filter may be used to remove higher frequency noise while maintaining an underlying shape of a peak corresponding to an environmental change. In some examples, multiple passes, e.g., 2 or 3 passes, through the smoothing filter 354 may be used.

A differentiator, environmental change sensor, and segmentation component 356 may receive the smoothed signal from the smoothing filter 354. The component 356 may include a derivative filter, e.g., a moving window first order derivative filter, to provide an indication of abrupt changes in the signal received from the smoothing filter. In some examples, only abrupt changes above a threshold are retained, so a rejection threshold may be established. The differentiator, environmental change sensor, and segmentation component 356 may apply criteria for sensing an environmental change. For example, a hover may be sensed by an increase in the summed smoothed signal followed by a decrease in the summed smoothed signal. However, during the hover (e.g., while an individual or a portion of the individual such as a hand is in proximity to the light source), smaller variations in the summed smoothed signal may occur due to minor variations in position. Accordingly, the component 356 may identify an environmental change only when an increase in the summed, smoothed signal greater than a threshold is followed by a decrease in the summed, smoothed signal greater than the threshold. There may also be time constraints for the occurrence of these two changes, e.g., after 600 ms but before 5 seconds.

Accordingly, a hover may be sensed by an EMI monitoring system described herein by sensing an energy increase in a summed, smoothed signal over a period of time. The sensing of a hover may be used as a building block for sensing more complex gestures, e.g., two or more hovers of particular length within a particular time. Because the system can sense a single hover, it may also be able to sense and report multiple hovers together with the duration of those hovers.

Another environmental change that may be sensed by EMI monitoring systems described herein include touches on a lamp shade, bulb, and/or base. A touch of a lamp shade may produce a higher change than that of a hover, while touching of the bulb itself may produce an even higher change than that of touching a lamp shade. Thresholds corresponding to each of these environmental changes may be stored or otherwise available to EMI monitoring systems described herein, allowing the EMI monitoring system to differentiate between a hover, lampshade touch, and/or bulb touch, for example. Moreover, the amount of signal change may vary in accordance with the touched surface area. Accordingly, EMI monitoring systems described herein may sense a touch with a smaller portion of a body differently than a touch with a larger portion of a body. So for example, the system may be able to differentiate between a one-finger touch, and a two-, three-, four-, or five-finger touch.

Another environmental change that may be sensed by EMI monitoring systems described herein includes a change in proximity, e.g., whether a hand or other body part is moving away from or toward a light source. Proximity changes may be sensed through detecting more gradual rather than abrupt changes in the summed, smoothed signal described above.

Another environmental change that may be sensed by EMI monitoring systems described herein include changes in temperature of the monitored light source and/or in the proximity of the monitored light source. Rather than changing harmonic energy, temperature changes may cause a frequency of the EMI signature of a light source to shift—by up to tens of kHz in some examples. Accordingly, tracking a fundamental frequency of an EMI signature over time may provide an indication of temperature changes. A calibration may be performed and/or stored to determine a temperature change based on a measured frequency shift. Generally, an increase in ambient temperature may cause a shift of an EMI signature to a lower frequency.

Figure 4:
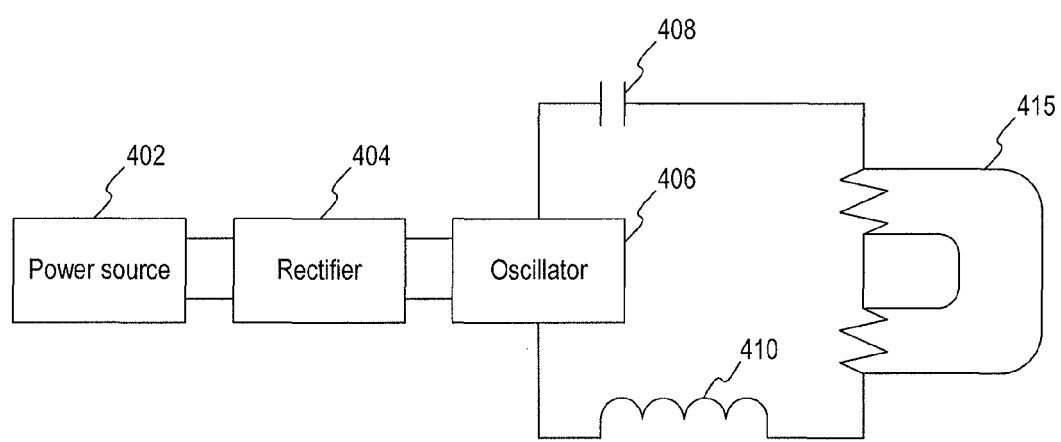
FIG. 4 is a block diagram of a compact fluorescent lamp that may be used in the electromagnetic interference monitoring system of FIG. 1 according to an embodiment of the invention.

FIG. 4 is a block diagram of a compact fluorescent lamp 400 according to an embodiment of the invention. The compact fluorescent lamp 400 may be used to implement a light source 104 of FIG. 1 and may include a power source 402, a rectifier 404, an oscillator 406, a capacitor 408, an inductor 410, and a lamp 415.

The power source 402 may provide a low-frequency AC power signal. The power source 402 may be any power source, such as an alternating current (AC) power source, and may, for instance, be coupled to or included in the power network 110. The rectifier 404 may receive the low-frequency AC power signal and in response may rectify the power signal to provide a direct current (DC) power signal. The rectifier 404 may be any rectifier known in the art, including but not limited to silicon controlled rectifiers (SCRs), and may provide the DC power signal using half-wave or full-wave rectification. The DC power signal may be provided to the oscillator 406 and thereby used to provide a high-frequency AC power signal. In one embodiment, the high-frequency AC power signal generated by the oscillator 406 may have a higher frequency than that of the low-frequency AC power signal provided by the power source 402. The high-frequency AC power signal may be used to provide power to the bulb 415 such that the bulb may operate in accordance with the frequency of the high-frequency power signal. The oscillator 406, capacitor 408, and inductor 410 may form a resonant circuit by which the current passing through the bulb 415 may be stabilized as the lamp 415 warms and/or maintain equilibrium in lamp current and voltage during operation. The oscillator 406 may emit EMI signals during operation of the light source 400 and/or during environmental changes that may be sensed and analyzed as described herein.

EXAMPLE

An example system will now be described for sensing environmental changes using EMI signals provided by light sources, such as the light sources 104. The example is not intended to be limiting.

Electromagnetic interference signals conducted onto the power network by various light sources may be measured by sampling the EMI signals at appropriate frequencies. Since the power network has a 60 Hz signal (50 Hz in Europe and Asia) meant to power electrical devices, it may be necessary to reject this 60 Hz component using high dynamic range analog circuitry. A prototype system makes use of an analog high-pass front end modified for a wider frequency response (corner frequency of 5.3 kHz). The signals from the front end are then digitized using USRP-1 (Universal Software Radio Peripheral), a general purpose, software configurable FPGA-based digitizer equipped with a 12-bit dual-channel ADC. The digitizer is configured to sample the EMI signals at 1 MS/s and compute a 16,384-point Fast Fourier Transform (FFT), yielding 61.03 FFT vectors per second. The magnitude in dB of each FFT vector is then computed before it is fed into the signal processing chain (see FIG. 5), for further processing.

For the purposes of this example, environmental changes are defined as instances in which a human is in proximity to a CFL and/or performing a gesture. Since the input signal is real valued and only magnitude was of interest in this example, the magnitude FFT vectors are symmetric around baseband, and hence half of the bins are redundant. These are truncated, reducing the number of points in the FFT vectors to 8192 across a spectral width of 500 kHz.

As described, human proximity to a CFL appears as increased energy in harmonics of the fundamental frequency at which the CFL produces EMI. Thus, a first step is to identify the fundamental and harmonic frequencies of the EMI. Though most CFLs have a switching frequency between 40 kHz and 120 kHz, it can vary from one brand to another and thus setting a global range for all lamps may not be practical. If the range to monitor is set too wide, the aggregate noise power from other sources may reduce the overall signal to noise ratio. Thus, a potential solution is to setup multiple narrow ranges specific to each CFL lamp and monitor each simultaneously.

Figure 5:
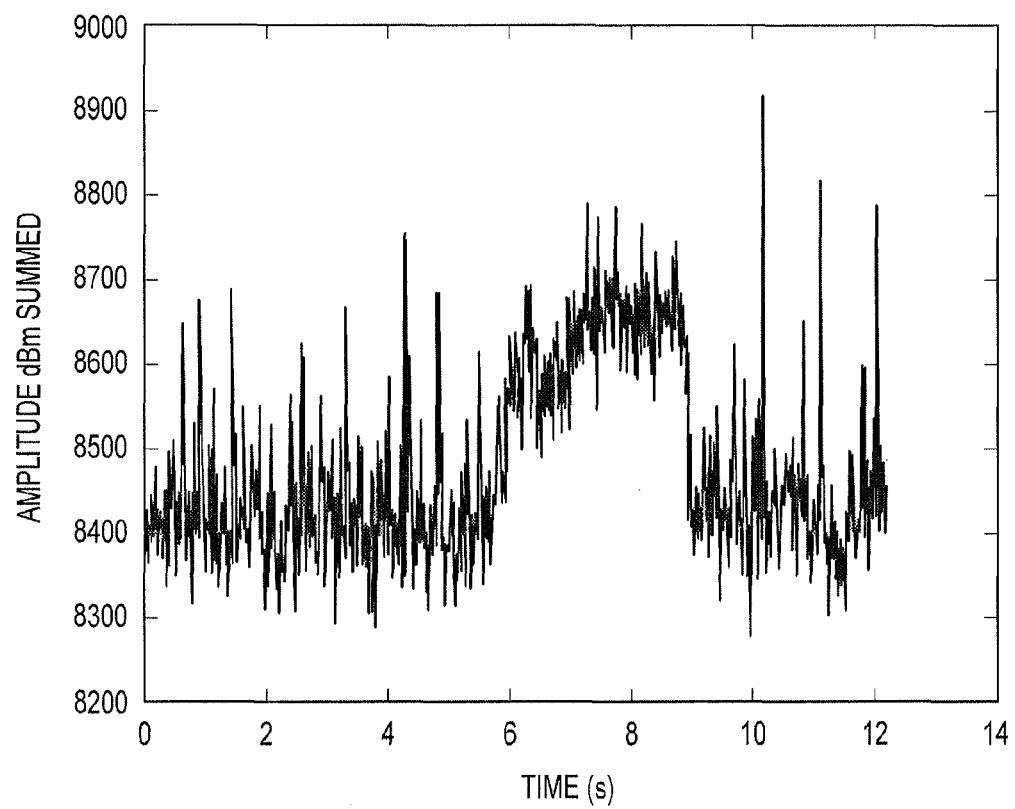
FIG. 5 is a diagram of a summed $3^{rd}$ harmonic frequency waveform according to an embodiment of the invention.

Once the frequency range for the desired bulb's 3rd harmonic is identified, a sum across this entire band is computed. For each FFT vector in time, a sum of energies in this range of frequencies is computed. FIG. 5 shows such a summed $3^{rd}$ harmonic frequency waveform over time for a lamp. When the energy in this range increases as a result of a gesture or human proximity, the sum also increases. The reason a sum over a frequency band is computed instead of tracking individual frequency bins over time is because even when the CFL is in equilibrium, its fundamental frequency may shift a few kHz over time due to temperature changes. Tracking a range of frequencies (in tens of kHz) may reduce the impact of such small shifts.

Figure 6:
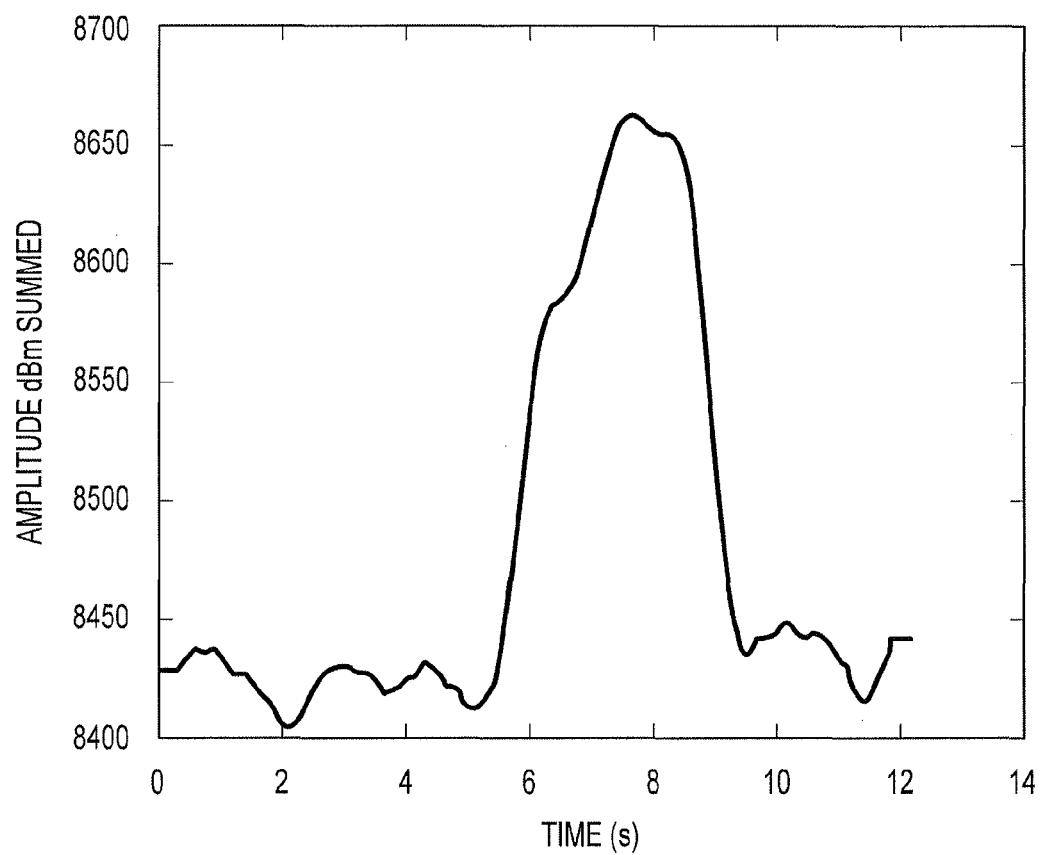
FIG. 6 is a diagram of a filtered summed $3^{rd}$ harmonic frequency waveform according to an embodiment of the invention.

As evident from FIG. 5, the summed $3^{rd}$ harmonic frequency waveform may be noisy and may be impractical for reliable sensing of environmental changes. In addition to EMI signals from other appliances, occasional broadband noise may also interfere with the EMI signal. The source of such broadband noise could be from flicking mechanical switches, noise from dimmers, or other switch mode power supplies, for example. Prior to taking the sum in a range of frequencies, FFT vectors may be discarded where the sum across the entire spectrum is more than 4 standard deviations greater than the running mean over 15 FFT vectors. To smooth the summed energy time series data, several filters may be used, including, but not limited to, averaging FIR filters and moving window Gaussian smoothing filters. In particular, a Savitzky-Golay smoothing filter with a degree of 1 and frame length of 39 may be used, and use of the result of using this filter is illustrated in FIG. 6. Not only does it remove the high frequency noise, but it also may maintain the underlying shape of the peak. Two passes of the same filter may be applied on the summed data, which minimizes noise and makes sensing environmental changes more reliable.

Figure 7:
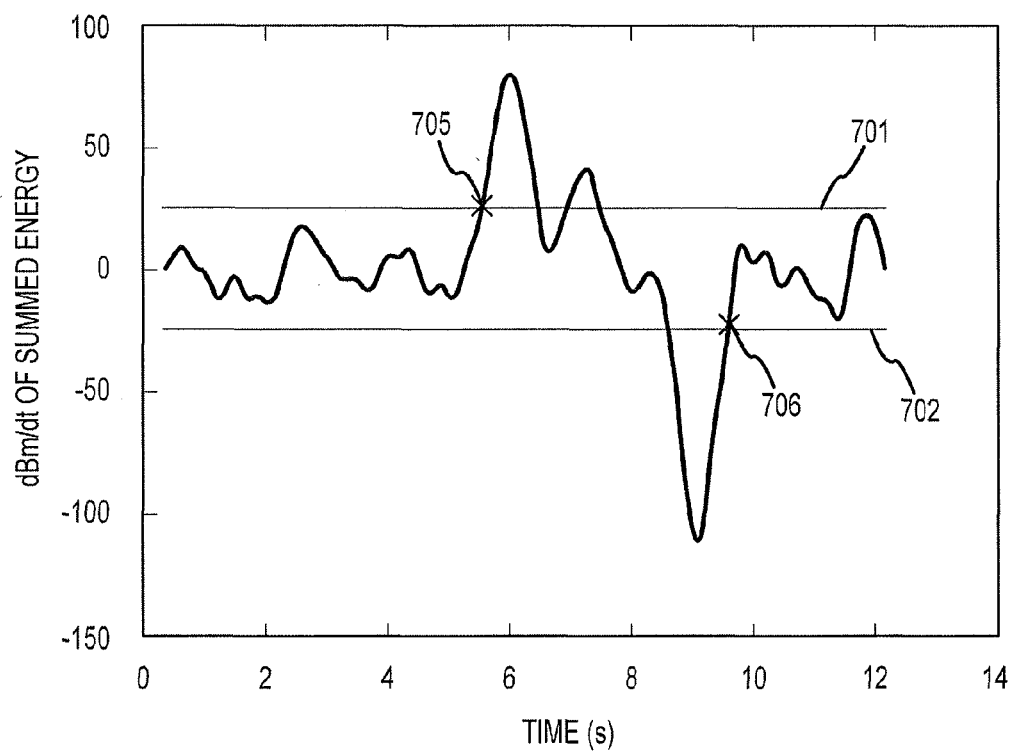
FIG. 7 is a diagram of a first derivative waveform of a filtered summed $3^{rd}$ harmonic frequency waveform according to an embodiment of the invention.

To sense environmental changes, a moving window first order derivative filter with a frame size of 20 is used to identify any abrupt changes in the signal. Since small abrupt changes also cause the derivative filter's output to generate a peak, it is necessary to set a rejection threshold. That is, it is desirable to only consider changes in summed energy that are abrupt as well as large in magnitude. A threshold value of 25 dB/dt (dt=20 frames, 0.327 s) may be chosen, which has good sensitivity to sensing hovers and other gestures while still maintaining a low false positive rate. The single threshold may be suitable for a variety of lamps. Lines 701 and 702 of FIG. 7 illustrate the threshold for positive and negative rates of change, respectively.

When a person approaches the lamp there may be an increase in the summed energy signal producing a large positive spike from the derivative filter. As the person moves away from the lamp, the summed energy signal decreases back to its baseline level, producing a comparable negative spike in the derivative filter. This phenomenon may be leveraged to identify the beginning and ending of an environmental change. Further leveraged may be the expectation that a large positive derivative should be directly followed by a large negative derivative to prevent the algorithm from over-segmenting a single environmental change. This may be used because during the environmental change the summed energy signal may be larger than normal, resulting variations in the signal that are also more intense—for example, when a person naturally moves closer or farther while performing a gesture. These subtle variations can also result in shifts in the derivative signal, illustrated in FIG. 7. The signal rises above the positive threshold, falls below the threshold and rises above the threshold again (due to variation in signal during the environmental change). It may be desirable to ignore the second positive threshold crossing to avoid overly segmenting a single environmental change. This may be achieved by including hysteresis into the threshold values.

Environmental changes that surpass the derivative threshold may also be required to meet a set of specific constraints. First, a positive derivative, which surpasses threshold, may be required to be followed by a negative derivative value that surpasses threshold at least after 600 ms, but no more than 5 seconds. Second, the peak derivative value of a positive spike and magnitude of the negative spike may be required to be within 30% of each other. This may ensure that dissimilar spikes are not matched. Third, when two or more consecutive positive spikes are followed by a negative spike, the process may be repeated for each spike, in chronological order. If a match is made, the remaining positive spikes may be discarded and the methodology moves on, begins searching for another positive spike after the matched negative spike. It should be noted that the maximum duration only limits the time for each gesture, not the time between them or the total duration of a complex gesture. For example, one can perform three hovers one after another forming a single complex gesture (at an application level) that lasts 6 seconds and each hover will be sensed. Points 705, 706 of FIG. 7 illustrate the beginning and end of a segment, respectively, as found by an example algorithm. These segments may then be identified as environmental changes.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method comprising:
    illuminating a space with a light source, wherein the light source includes an internal oscillator used during the illuminating; and
    sensing an environmental change with the light source based, at least in part, on a change in operation of the internal oscillator.

2. The method of claim 1, further comprising:
    receiving an electromagnetic interference signal from the light source;
    sampling the electromagnetic interference signal to generate a set of environmental data; and
    analyzing the set of environmental data to identify the environmental change.

3. The method of claim 2, wherein the light source comprises a bulb having a ballast, a switching power supply, or a combination thereof.

4. The method of claim 3, wherein analyzing the set of environmental data comprises:
    determining whether the environmental change comprises motion relative to the bulb, a touch of the bulb, a hover near the bulb, a touch of a lamp of the bulb, a temperature variation, or a combination thereof.

5. The method of claim 2, wherein receiving the electromagnetic interference signal comprises:
receiving the electromagnetic interference signal over a power network.

6. The method of claim 2, wherein receiving the electromagnetic interference signal comprises:
receiving the electromagnetic interference signal within the light source.

7. The method of claim 2, wherein analyzing the set of environmental data comprises:
identifying variations in a fundamental frequency of the electromagnetic interference signal.

8. The method of claim 1, wherein said sensing the environmental change is based, at least in part, on an electromagnetic interference signal from the light source.

9. An electromagnetic interference monitoring system comprising:
a power network interface configured to receive an electromagnetic interference signal over a power network from a light source operating in accordance with an oscillator signal; and
at least one processing unit and at least one computer readable medium encoded with instructions that, when executed, cause the at least one processing unit to:
process the electromagnetic interference signal; and
sense an environmental change based on a variation in the processed electromagnetic interference signal according to one or more criteria, wherein the environmental change caused the variation in the electromagnetic interference signal.

10. The electromagnetic interference monitoring system of claim 9, wherein the power network interface is configured to receive the electromagnetic interference signal over a power network using inductive coupling.

11. The electromagnetic interference monitoring system of claim 9, wherein the electromagnetic interference signal comprises a fundamental frequency and a plurality of harmonic frequencies.

12. The electromagnetic interference monitoring system of claim 9, wherein the light source comprises a bulb having a ballast, a bulb having a switching power supply, or a combination thereof.

13. The electromagnetic interference monitoring system of claim 9, wherein the system further includes a transform component configured to convert the electromagnetic interference signal to the frequency domain;
a frequency detector component configured to identify one or more frequencies of the electromagnetic interference signal and sum the one or more frequencies of the electromagnetic interference signal over time; and
a filter configured to smooth the summed electromagnetic interference signal.

14. The electromagnetic interference monitoring system of claim 9, wherein the environmental change comprises a gesture, a temperature variation, or a combination thereof.

15. The electromagnetic interference monitoring system of claim 14, wherein the gesture comprises motion relative to the light source, a touch of the light source, a hover near the light source, a touch of the light source housing, or a combination thereof.

16. The electromagnetic interference monitoring system of claim 9, wherein the one or more criteria includes criteria for rates of change and magnitude.

17. The electromagnetic interference monitoring system of claim 9, wherein the instructions further cause the at least one processing unit to:
monitor a frequency range comprising a fundamental frequency of the electromagnetic interference signal.

18. A method, comprising:
monitoring a plurality of frequency ranges on a power network;
receiving an electromagnetic interference signal having a fundamental frequency within one of the plurality of frequency ranges;
processing the electromagnetic interference signal; and
after processing the electromagnetic interference signal, sensing environmental changes based, at least in part, on one or more variations of the electromagnetic interference signal.

19. The method of claim 18, wherein monitoring the plurality of frequency ranges comprises:
rejecting a power signal on the power network.

20. The method of claim 18, wherein each of the plurality of frequency ranges corresponds to a respective light source.

21. The method of claim 20, wherein at least one respective light sources comprises a bulb having a ballast, a switching power supply, or a combination thereof.

22. The method of claim 18, further comprising:
calibrating with a light source; and
responsive to the calibrating, monitoring the one of the plurality of frequency ranges.

23. The method of claim 22, wherein calibrating with the light source comprises:
detecting a presence of the electromagnetic interference signal on the power network.

24. The method of claim 18, wherein processing the electromagnetic interference signal comprises:
converting the electromagnetic interference signal to a frequency domain;
identifying one or more frequencies of the electromagnetic interference signal;
summing the one or more frequencies of the electromagnetic interference signal for each of a plurality of vectors in time; and
filtering the electromagnetic interference signal.

* * * * *